United States Patent
Seon et al.

(10) Patent No.: US 8,900,799 B2
(45) Date of Patent: Dec. 2, 2014

(54) THIN FILM PATTERNING METHOD AND METHOD OF MANUFACTURING SEMICONDUCTOR DEVICE USING THE THIN FILM PATTERNING METHOD

(75) Inventors: Jong-baek Seon, Yongin-si (KR); Myung-kwan Ryu, Yongin-si (KR); Sang-yoon Lee, Seoul (KR)

(73) Assignees: Samsung Electronics Co., Ltd., Gyeonggi-Do (KR); Samsung Display Co., Ltd., Gyeonggi-Do (KR)

( * ) Notice: Subject to any disclaimer, the term of this patent is extended or adjusted under 35 U.S.C. 154(b) by 21 days.

(21) Appl. No.: 13/588,689

(22) Filed: Aug. 17, 2012

(65) Prior Publication Data

US 2013/0183609 A1  Jul. 18, 2013

(30) Foreign Application Priority Data

Jan. 16, 2012  (KR) .................. 10-2012-0004912

(51) Int. Cl.
G03F 7/20 (2006.01)
H01L 21/46 (2006.01)

(52) U.S. Cl.
CPC ............. *G03F 7/2002* (2013.01); *H01L 21/46* (2013.01)
USPC ............................. 430/313; 430/311; 430/330

(58) Field of Classification Search
CPC ............. G03F 7/20; G03F 7/26; G03F 7/38; G03F 7/40
USPC ............................. 430/322, 330, 311
See application file for complete search history.

(56) References Cited

U.S. PATENT DOCUMENTS

| 2002/0076495 A1* | 6/2002 | Maloney et al. ............... 427/272 |
| 2007/0003877 A1 | 1/2007 | Punsalan et al. |
| 2007/0092981 A1 | 4/2007 | Jung et al. |
| 2008/0057631 A1 | 3/2008 | Cheng et al. |
| 2009/0068800 A1 | 3/2009 | Nelson et al. |

FOREIGN PATENT DOCUMENTS

| KR | 20030053570 A | 7/2003 |
| KR | 2009-0050614 A | 5/2009 |
| KR | 2010-0072977 A | 7/2010 |

OTHER PUBLICATIONS

Y. Kang et al. "UV irradiation effect on sol-gel indium tin oxide nanopatterns replicated by room-temperature nanoimprint"; Journal of Vacuum Science & Technology B, vol. 27, p. 2805-2809; 2009.

N. Asakuma et al. "Crystallization and Reduction of Sol-Gel-Derived Zinc Oxide Films by Irradiation with Ultraviolet Lamp"; Journal of Sol-Gel Science and Technology, vol. 26, p. 181-184; 2003.

T. Nagase et al. "Green Cathodoluminescence Properties of Zinc Oxide Films Prepared by Excimer Laser Irradiation of a Sol-Gel-Derived Precursor"; Japanese Journal of Applied Physics, vol. 42, p. 1179-1184; 2003.

(Continued)

*Primary Examiner* — Kathleen Duda
(74) *Attorney, Agent, or Firm* — Harness, Dickey & Pierce, P.L.C.

(57) ABSTRACT

A thin film patterning method may include forming a thin film by coating a precursor solution containing a precursor of metal oxide onto a substrate, soft baking the thin film, exposing the thin film to light by using a photomask, developing the thin film, and hard baking the developed thin film. The precursor may include metal acetate, for example, a zinc acetate-based material, and the metal oxide thin film may include zinc oxide (ZnO).

18 Claims, 9 Drawing Sheets

(56) References Cited

OTHER PUBLICATIONS

L. Scalvi et al. "Improved Conductivity Induced by Photodesorption in SnO2 Thin Films Grown by a Sol-Gel Dip Coating Technique"; Journal of Sol-Gel Science and Technology, vol. 13, p. 793-798; 1998.

T. Nagase et al. "Improvement of green cathodoluminescence of zinc oxide stacked films prepared by high-power excimer laser irradiation of sol-gel-derived precursors"; Thin Solid Films, vol. 518, p. 3875-3878; 2010.

Y. Chen et al. "Microfabrication of dilute magnetic semiconducting Ti1—xCoxO2 films using photosensitive sol-gel method"; Thin Solid Films, vol. 519, p. 1985-1988; 2011.

C. Yuanqing et al. "Photosensitive sol-gel preparation and direct micro-patterning of c-oriented ZnO film"; Applied Surface Science, vol. 257, p. 6817-6820; 2011.

T. Ehara et al. "Preparation of ZnO thin film by the sol-gel method using low temperature ozone oxidation"; Physica Status Solidi (a), vol. 207, p. 1600-1603; 2010.

W.M. Tang et al. "Transparent conducting aluminum-doped zinc oxide thin film prepared by sol-gel process followed by laser irradiation treatment"; Thin Solid Films,. vol. 517, p. 891-895; 2008.

* cited by examiner

< SOFT BAKE >

< HARD BAKE >

THIN FILM PATTERNING METHOD AND METHOD OF MANUFACTURING SEMICONDUCTOR DEVICE USING THE THIN FILM PATTERNING METHOD

CROSS-REFERENCE TO RELATED APPLICATION

This application claims the benefit of Korean Patent Application No. 10-2012-0004912, filed on Jan. 16, 2012, in the Korean Intellectual Property Office, the disclosure of which is incorporated herein in its entirety by reference.

BACKGROUND

1. Field

Some example embodiments relate to thin film patterning methods and/or methods of manufacturing semiconductor devices using the thin film patterning methods.

2. Description of the Related Art

In general, a photolithography process is progressed in such a way that a photoresist film is formed on a predetermined thin film to be patterned, the photoresist film is patterned using exposure and developing processes and then the thin film is patterned (e.g., etched) by using the patterned photoresist film as an etch mask.

However, when the predetermined thin film is patterned using the photoresist film in this way, the thin film may be damaged, denaturalized, or contaminated by various chemical materials used in forming, developing and removing the photoresist film. In particular, since a metal oxide that has recently drawn attention as material for a semiconductor device, such as a transistor, does not have sufficient chemical resistance, the metal oxide may be vulnerable to both acidic and basic materials.

Thus, when the metal oxide thin film is patterned using a photolithography process according to the related art, there may be a possibility that the metal oxide thin film is damaged, denaturalized, or contaminated. In addition, in the photolithography process according to the related art, the number of processes increases due to the processes of forming, developing, and removing the photoresist film.

SUMMARY

Some example embodiments provide thin film patterning methods without forming photoresist films. Some example embodiments also provide thin film patterning methods, whereby damage and contamination of thin films may be minimized or reduced.

Some example embodiments also provide thin film patterning methods of which processes are simplified.

Some example embodiments provide methods of manufacturing semiconductor devices using the thin film patterning methods.

Additional aspects will be set forth in part in the description which follows and, in part, will be apparent from the description, or may be learned by practice of example embodiments.

According to an example embodiment, a thin film patterning method includes preparing a precursor solution including a precursor of metal oxide, forming a thin film by coating the precursor solution onto a substrate, soft baking the thin film, exposing the thin film to light using a photomask in an ozone atmosphere, developing the thin film by removing an unexposed portion of the thin film, and hard baking the developed thin film.

Preparing the precursor solution may include preparing one of metal acetate and metal acetate hydrate. Preparing the precursor solution may include preparing a precursor of zinc oxide, and the precursor of zinc oxide may include one of zinc acetate and zinc acetate dihydrate. Preparing the precursor solution may include dissolving the precursor of metal oxide using 2-methoxyethanol as a solvent. Ethanolamine may be added as an additive.

The thin film may be soft baked at a temperature of about 50° C. to about 80° C. for about 30 seconds to about 5 minutes. The thin film may be exposed using ultraviolet rays (UV). The thin film may be developed using a developing solution including 2-methoxyethanol. The thin film may be developed by immersing the substrate into a developing solution, and applying ultrasonic vibration to the thin film immersed in the developing solution. The developed thin film may be hard baked at a temperature of about 300° C. to about 600° C.

According to another example embodiment, a thin film patterning method includes preparing a precursor solution including a metal acetate-based material as a precursor of metal oxide, forming a thin film by coating the precursor solution onto a substrate, soft baking the thin film at a temperature of about 50° C. to about 80° C., exposing the thin film to ultraviolet rays (UV) through a photomask, developing the thin film by removing an unexposed portion of the thin film using a developing solution including 2-methoxyethanol, and hard baking the developed thin film.

According to another example embodiment, a method of manufacturing a transistor includes forming a channel layer, forming a source and a drain connected to first and second regions of the channel layer, respectively, and forming a gate corresponding to the channel layer. The channel layer may be formed by forming a metal oxide thin film using the thin film patterning method.

The channel layer may be formed by forming a zinc oxide (ZnO) thin film. The channel layer may be formed by forming a zinc oxide (ZnO) thin film including at least one additional metal element. The gate may be formed below or above the channel layer.

According to another example embodiment, a precursor solution for patterning a thin film includes a precursor of a metal oxide.

The metal oxide may be zinc oxide (ZnO). The precursor of the metal oxide may include one of a zinc acetate and a zinc acetate dihydrate. The zinc acetate may be represented by a formula $Zn(O_2CCH_3)_2$, and the zinc acetate dihydrate may be represented by a formula $Zn(O_2CCH_3)_2(H_2O)_2$. The precursor solution may further include a solvent for dissolving the precursor, and an additive for increasing solubility of the precursor. The solvent may include 2-methoxyethanol, and the additive may include ethanolamine. The precursor solution may include an additional metal element including one of hafnium (Hf), yttrium (Y), tantalum (Ta), zirconium (Zr), titanium (Ti), copper (Cu), nickel (Ni), chromium (Cr), indium (In), gallium (Ga), aluminum (Al), tin (Sn), and magnesium (Mg).

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
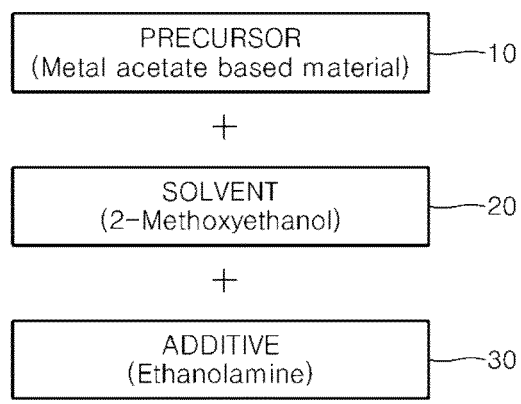
FIG. 1 illustrates materials used in forming a precursor solution, e.g., a composition of the precursor solution, which is used in a thin film patterning method according to an example embodiment.

Various example embodiments will now be described more fully with reference to the accompanying drawings in which some example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, the inventive concepts will be described more fully with reference to the accompanying drawings, in which example embodiments are shown. Widths and thicknesses of layers or regions in the drawings may be exaggerated for clarity. Like reference numerals in the drawings refer to like elements throughout.

FIG. 1 illustrates materials used in forming a precursor solution, e.g., a composition of the precursor solution, which is used in a thin film patterning method according to an example embodiment.

Referring to FIG. 1, the precursor solution may include a precursor 10 of a metal oxide. The precursor 10 of the metal oxide may include a metal acetate-based material, such as metal acetate or metal acetate hydrate. For example, the metal oxide may be zinc oxide (ZnO). In example embodiments, the precursor 10 may include zinc acetate or zinc acetate dihydrate. The formula of zinc acetate may be $Zn(O_2CCH_3)_2$, and the formula of zinc acetate dihydrate may be $Zn(O_2CCH_3)_2(H_2O)_2$.

The precursor solution may include a solvent 20 for dissolving the precursor 10. The solvent 20 may include 2-methoxyethanol, for example. The molecular formula of 2-methoxyethanol is $C_3H_8O_2$. A boiling point of 2-methoxyethanol is about 125° C. The solvent 20 may include an alcohol-based solvent other than 2-methoxyethanol, or may also include a different solvent as well as 2-methoxyethanol. The concentration of the precursor 10 with respect to the solvent 20 may be about 0.01M to about 1M. For instance, the precursor 10 may be mixed with the solvent 20 at a concentration of about 0.3M.

The precursor solution may further include a given (or alternatively, predetermined) additive 30. The additive 30 may serve to increase solubility of the precursor 10, to improve stability of the precursor solution, or the like. For example, the additive 30 may include ethanolamine. The molecular formula of ethanolamine is $C_2H_7NO$. Ethanolamine may be added at an equivalent compared to metal acetate or metal acetate hydrate of the precursor 10, but this amount is just an example and may vary. In addition, the additive 30 may include diethanolamine or triethanolamine.

Although not shown in FIG. 1, the precursor solution may further include a source material of an additional metal element. For example, when the precursor 10 includes a precursor of ZnO, the precursor solution may further include a source material of at least one metal element selected from the group consisting of hafnium (Hf), yttrium (Y), tantalum (Ta), zirconium (Zr), titanium (Ti), copper (Cu), nickel (Ni), chromium (Cr), indium (In), gallium (Ga), aluminum (Al), tin (Sn), magnesium (Mg), and the like. In this case, a metal oxide thin film formed from the precursor solution may be a thin film including ZnO and at least one additional metal element.

The following Table 1 shows a composition of the precursor solution according to an experimental example.

TABLE 1

| Classification | Material | Remarks |
| --- | --- | --- |
| Precursor | Zinc acetate dihydrate | Precursor is mixed with solvent at a concentration of 0.3M. |
| Solvent | 2-methoxyethanol | |
| Additive | Ethanolamine | Additive is added at an equivalent compared to precursor. |

As shown in Table 1, according to the experimental example, the precursor solution may be prepared by dissolving a zinc acetate dihydrate precursor in a 2-methoxyethanol solvent at a concentration of 0.3M and by adding ethanolamine to the 2-methoxyethanol solvent at an equivalent compared to the precursor. The experimental example is just an example, and materials, dissolution concentration, added amount, and the like may vary.

In addition, the precursor solution used in the thin film patterning method according to an example embodiment may not include an additive (or accelerator) that induces an optical reaction. Here, the optical reaction may refer to a reaction in which a material is activated by light, for example, a hardened reaction. The precursor solution may be more easily hardened by light in a given (or alternatively, predetermined) condition without using an additive that induces the optical reaction. This will be described in more detail with reference to FIGS. 2A through 2G. As such, in the example embodiment, the precursor solution does not use an additive (accelerator) that induces the optical reaction. Thus, the composition of the precursor solution may be simplified, and characteristics, quality, or the like of the metal oxide thin film formed from the precursor solution may be improved.

Figure 2A:
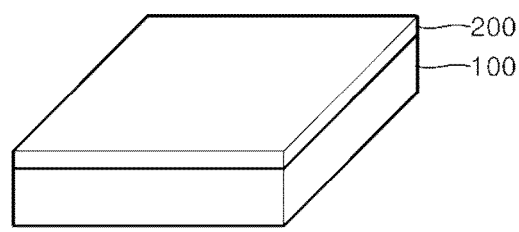
FIGS. 2A through 2G are perspective views illustrating a thin film patterning method according to an example embodiment.

FIGS. 2A through 2G are perspective views illustrating a thin film patterning method according to an example embodiment. Referring to FIG. 2A, a thin film 200 may be formed by coating a precursor solution of a metal oxide onto a substrate 100. The precursor solution may be the same as the precursor solution described with reference to FIG. 1, and thus, repeated descriptions thereof are omitted. There may be various methods of coating the precursor solution onto the substrate 100. For example, the precursor solution may be coated onto the substrate 100 by using spin coating. In this case, the precursor solution may be spin coated at several hundreds to several thousands of rpm for several to several tens of seconds. The precursor solution may be coated onto the substrate 100 by using another method, such as dip coating, spray coating, or the like. The substrate 100 may be one of various substrates used in a general semiconductor device process, such as a glass substrate, a plastic substrate, a silicon substrate, or the like. In addition, after a given (or alternatively, predetermined) material layer (not shown) is first formed on the substrate 100, the thin film 200 may be formed on the material layer. For example, after forming a silicon oxide layer (not shown) on the substrate 100 formed of silicon, the thin film 200 may be formed on the silicon oxide layer.

Figure 2B:
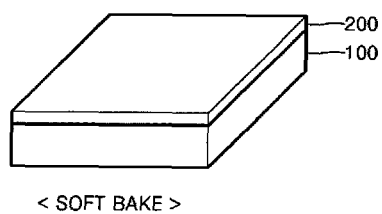

Referring to FIG. 2B, the thin film 200 may be soft baked in a given (or alternatively, predetermined) condition. The soft baking process may be performed at a temperature of about 50-80° C., for example, at a temperature of about 55-70° C. The soft baking process may be performed for about 30 seconds to 5 minutes, for example, 30 seconds to 2 minutes. As a concrete example, the soft baking process may be performed at a temperature of about 60° C. for about 1 minute. By drying the thin film 200 in this condition, some of the solvent, e.g., 2-methoxyethanol, may be properly evaporated from the thin film 200 so that fluidity of the thin film 200 may be reduced.

The soft baking process may be a preliminary (preparation) operation for hardening the thin film 200 by using an exposure process, e.g., a light irradiation process. If a temperature of the soft baking process is too low, the thin film 200 may be not properly hardened using the exposure process, e.g., the light irradiation process. Also, if the temperature of the soft baking process is too low, a plurality of pin holes may be formed in the thin film 200, and the thin film 200 may be contaminated by particles attached thereto from the air. If the temperature of the soft baking process is too high, an unexposed portion of the thin film 200, e.g., a portion onto light is not irradiated, may not be easily removed. In the present embodiment, the soft baking process is performed at a temperature of about 50-80° C., for example, at a temperature of about 55-70° C. so that contamination of the thin film 200 due to the particles and forming of the pinholes may be suppressed or prevented. A process of patterning the thin film 200 may be more easily performed using subsequent processes, that is, an exposure process (e.g., a light irradiation process) and a developing process.

Figure 2C:
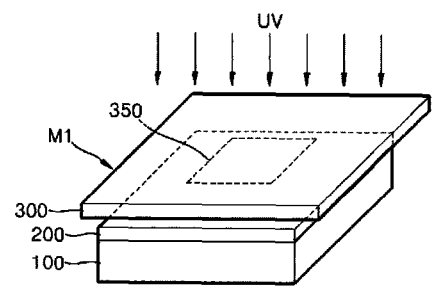

Referring to FIG. 2C, a given (or alternatively, predetermined) photomask M1 may be disposed above (or on) the thin film 200, and light, for example, ultraviolet ray (UV), may be irradiated onto the thin film 200 through the photomask M1. That is, an exposure process with regard to the thin film 200 may be performed using the photomask M1. The photomask M1 may have a structure in which a given (or alternatively, predetermined) opaque pattern layer 350 is coated on a transparent plate 300. For example, material for the transparent plate 300 may be glass, and material for the opaque pattern layer 350 may be Cr. The structure and composition of the photomask M1 are just an example. Materials for the transparent plate 300 and the opaque pattern layer 350 may vary, and the shape of the opaque pattern layer 350 may be variously modified. The exposure process may be performed using UV in an ozone ($O_3$) atmosphere. In other words, the exposure process may be performed using UV/ozone.

A region of the thin film 200 onto which UV is irradiated, may be hardened by UV. That is, a precursor, e.g., metal acetate or metal acetate hydrate, of the thin film 200 may be dissolved by the energy of UV, and a combination between metal and oxide is somewhat progressed so that the thin film 200 may be hardened. When the hardening process is performed using UV in the ozone atmosphere, the thin film 200 may be more easily hardened. In the present operation, the hardening of the thin film 200 may not be complete hardening but semi-hardening or partial hardening. A region of the thin film 200 onto which UV is not irradiated, may be maintained in an unhardened state.

Figure 2D:
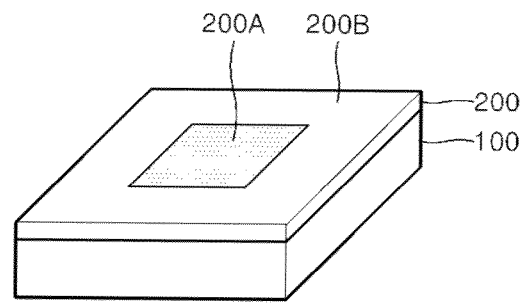

A resultant structure of the exposure process of FIG. 2C is shown in FIG. 2D. Referring to FIG. 2D, the thin film 200 may have a hardened, first region 200A and an unhardened, second region 200B. The first region 200A is a UV-irradiated region in FIG. 2C, and the second region 200B is a region onto which UV is not irradiated.

Figure 2E:
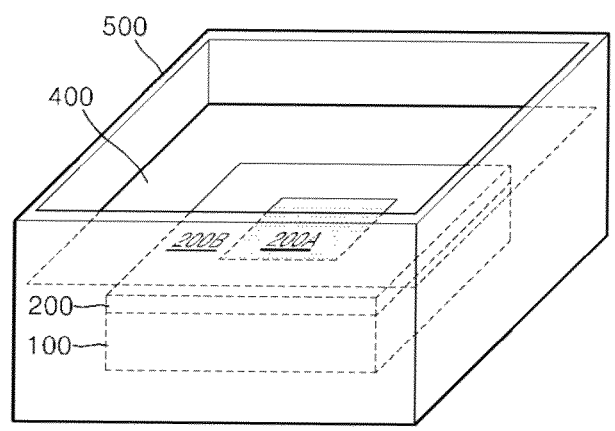

Referring to FIG. 2E, a developing process of the thin film 200 may be performed. That is, a process of selectively removing the unhardened, second region 200B from the thin film 200 may be performed. For example, the substrate 100, on which the thin film 200 is formed, may be introduced into a container 500 in which a given (or alternatively, predetermined) developing solution 400 is accommodated. The developing solution 400 may include 2-methoxyethanol, for example. The developing solution 400 is not limited to 2-methoxyethanol and may vary. That is, the developing process may be performed using an alcohol-based solution other than 2-methoxyethanol as the developing solution 400. The developing process may be performed for about 1 minute to about 1 hour, for example, for about 20 minutes to 40 minutes. In addition, the developing process may further include an operation of applying ultrasonic vibration to the thin film 200 immersed into the developing solution 400. By applying ultrasonics to the container 500, ultrasonic vibration may be transferred to the thin film 200. In this way, if the developing process is performed while applying the ultrasonic vibration to the thin film 200, efficiency of the developing process may be improved.

Figure 2F:
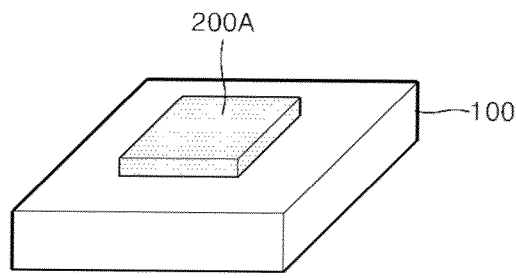

A resultant structure of the developing process of FIG. 2E is shown in FIG. 2F. Referring to FIG. 2F, the unhardened, second region 200B (see FIG. 2E) is removed from the thin film 200, and the hardened, first region 200A remains in the thin film 200. The remaining, first region 200A may be a developed thin film or a patterned thin film. Hereinafter, the remaining, first region 200A is referred to as a "developed thin film 200A".

Figure 2G:
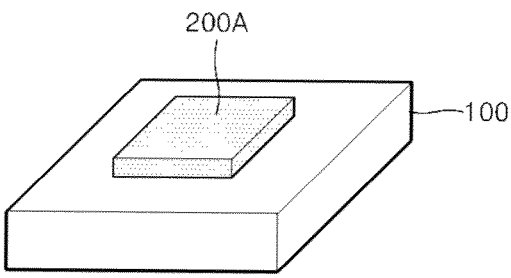

Referring to FIG. 2G, a hard baking process of the developed thin film 200A may be performed. The hard baking process may be performed at a relatively high temperature, for example, at a temperature of about 300-600° C. for about 1 minutes to 3 hours, for example. As a concrete example, the hard baking process may be performed at a temperature of about 450° C. for about 30 minutes. Combination between metal and oxide may be completely or nearly completely performed in the developed thin film 200A by using the hard baking process. As a result, the developed thin film 200A may be a solidly hardened "metal oxide thin film". The metal oxide thin film may be referred to as a patterned metal oxide thin film. In addition, the metal oxide thin film may be a semiconductor thin film having semiconductor characteristics.

In this way, according to the present embodiment, an additional photoresist film is not formed on the thin film 200 but light is irradiated directly onto the thin film 200 and the thin film 200 is developed and thus may be patterned. That is, the patterning method of the present embodiment is a photoresist-free (PR-free) patterning process. Thus, according to the present embodiment, problems that occur due to an additional photoresist film may be prevented or inhibited. For example, damage, denaturalization, or contamination of the thin film 200 due to various chemical materials used in forming, developing, and removing the photoresist film may be prevented or inhibited. In particular, when patterning a thin film, for example, a metal oxide thin film, having relatively insufficient chemical resistance, the thin film patterning method according to the present embodiment may be favorably applied. In addition, the thin film patterning method according to the present embodiment does not include the processes of forming, developing, and removing the photoresist film, and thus processes of the thin film patterning method may be simplified.

Figure 3:
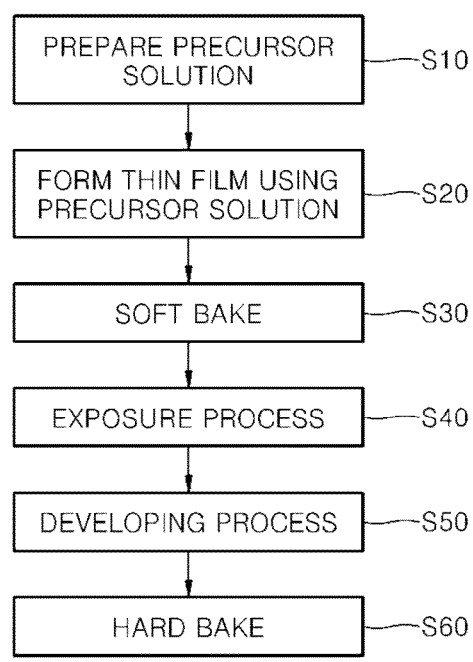
FIG. 3 is a flowchart summarizing the thin film patterning method illustrated in FIGS. 2A through 2G.

FIG. 3 is a flowchart summarizing the thin film patterning method described with reference to FIGS. 2A through 2G. Referring to FIG. 3, a precursor solution may be prepared in operation S10. The precursor solution may be coated onto a substrate to form a thin film in operation S20, and a soft baking process of the thin film may be performed in operation S30. The thin film may be exposed to light using a photomask in operation S40, a developing process for removing an unexposed region of the thin film may be performed in operation S50, and a patterned metal oxide thin film may be formed by performing a hard baking process of the developed thin film in operation S60.

The precursor solution prepared in the first operation S10 may be the same as described with reference to FIG. 1. The exposure process of the fourth operation S40 may be performed in an ozone ($O_3$) atmosphere, and in the fifth operation S50, ultrasonic vibration may be applied to the thin film. Other detailed process conditions may be the same as described with reference to FIGS. 2A through 2G.

Figure 4:
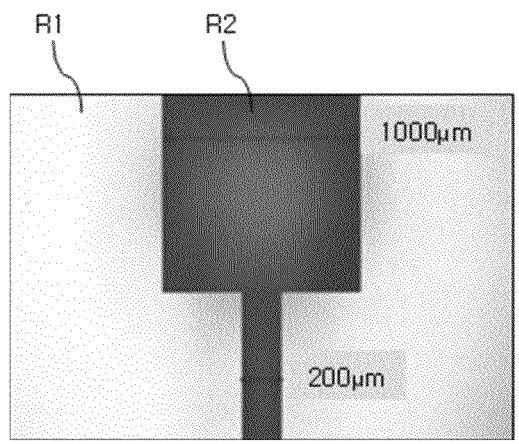
FIG. 4 is a top view image (photo) of a photomask that may be used in a thin film patterning method according to an example embodiment.
Figure 5:
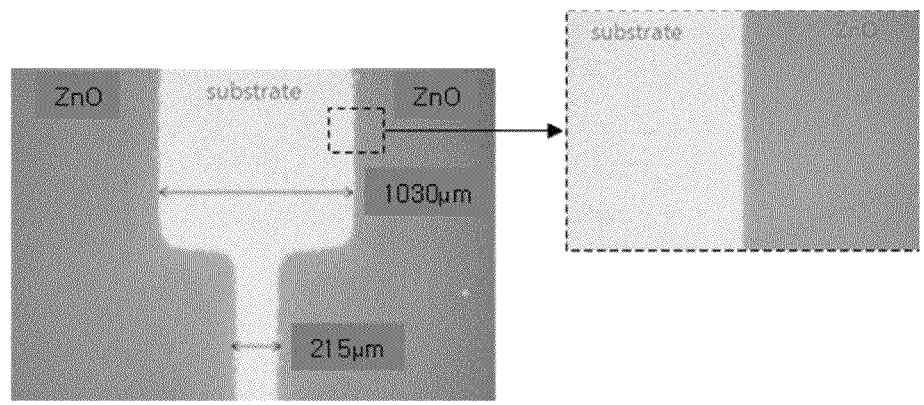
FIG. 5 is a top view image (photo) of a metal oxide (ZnO) thin film formed by a thin film patterning method using the photomask of FIG. 4, according to an example embodiment.

FIG. 4 is a top view image (photo) of a photomask that may be used in the thin film patterning method according to an example embodiment, and FIG. 5 is a top view image (photo) of a metal oxide (ZnO) thin film formed by the thin film patterning method according to an example embodiment, by using the photomask of FIG. 4.

Referring to FIG. 4, the photomask includes an uncoated portion R1 and a coated portion R2. The coated portion R2 may be a region coated with an opaque material, such as Cr, similar to the opaque pattern layer 350 of FIG. 2C. The uncoated portion R1 may be a transparent region. Given (or alternatively, predetermined) light (e.g., UV) may be irradiated onto a thin film (not shown) disposed under the uncoated portion R1 through the uncoated portion R1. Thus, light may be selectively irradiated onto a region of the thin film corresponding to the uncoated portion R1, and the irradiated region of the thin film may be hardened.

Referring to FIG. 5, the shape of the metal oxide (ZnO) thin film formed using the photomask of FIG. 4 corresponds to the shape of the uncoated portion R1 of the photomask. That is, the metal oxide (ZnO) thin film corresponding to the uncoated portion R1 of FIG. 4 is formed, and the region of the thin film corresponding to the coated portion R2 is removed so that the substrate is exposed. A dimension (width) of each region of the patterned metal oxide (ZnO) thin film may nearly correspond to a dimension (width) of each region of the photomask of FIG. 4. Referring to the partial enlarged view of FIG. 5, a border between the metal oxide (ZnO) thin film and the substrate is clear, and the surface of the substrate is exposed in a clean state. As is obvious from the result, the metal oxide thin film may be cleanly patterned in a desired shape by using the example embodiment.

The following Table 2 shows a thickness and a refractive index of a thin film formed according to an example embodiment and a thickness and a refractive index of a thin film formed according to a comparative example. The thin film according to the example embodiment is manufactured through a hard baking process after performing light irradiation. In this case, light irradiation was performed using UV in an ozone ($O_3$) atmosphere for about 30 minutes. Meanwhile, the thin film according to the comparative example is manufactured by a hard baking process without performing light irradiation.

TABLE 2

|  | Light irradiation | Thickness (Å) | Refractive index |
|---|---|---|---|
| Embodiment | Performing | 347 | 1.5465 |
| Comparative example | Not performing | 196 | 1.5792 |

As shown in Table 2, the thin film according to the example embodiment formed by a light irradiation process and a hard baking process has a refractive index of 1.5465. Meanwhile, the thin film according to the comparative example formed by a hard baking process without light irradiation has a refractive index of 1.5792. As is obvious from Table 2, there is only a little difference between the refractive index of the thin film on which light irradiation was performed, and the refractive index of the thin film on which light irradiation was not performed. In addition, since there is some difference in refractive index of a thin film according to thickness thereof when the thin film is formed by a sol-gel method, the difference in the refractive indices of the thin films between the example embodiment and the comparative example may be due to a difference in thickness between the thin films. As is obvious from the results, light irradiation may not affect characteristics (refractive indices) of the thin films. That is, the characteristics of the thin films may not be deteriorated or denaturalized due to light irradiation.

The above-described thin film patterning method according to the example embodiment may be applied to manufacturing processes of various devices including thin films. In particular, the thin film patterning method according to the example embodiment may be favorably or usefully applied to manufacturing processes of a device including a metal oxide thin film.

Figure 6A:
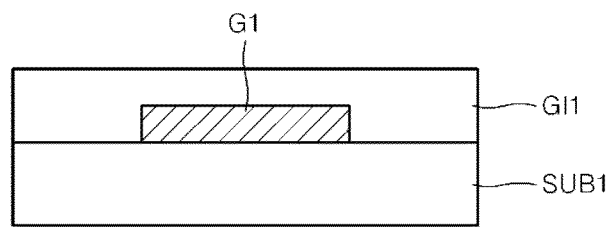
FIGS. 6A through 6C are cross-sectional views illustrating a method of manufacturing a semiconductor device (transistor) by using a thin film patterning method, according to an example embodiment.
Figure 6B:
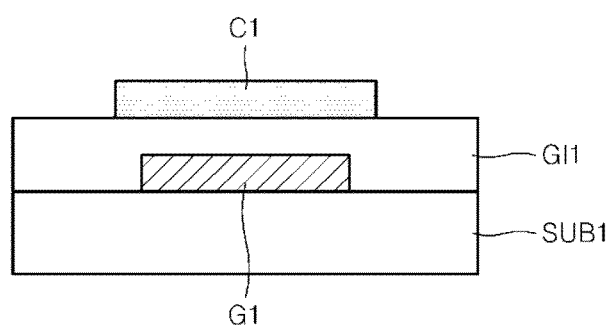
Figure 6C:
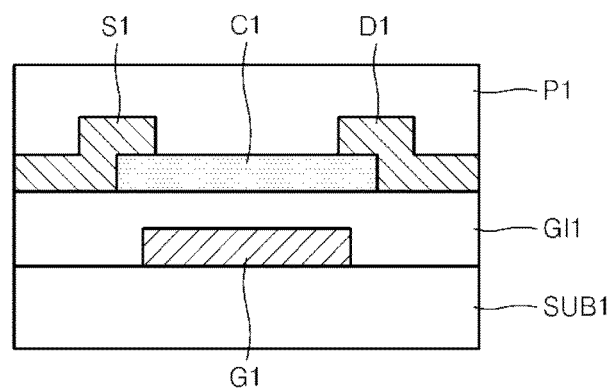

FIGS. 6A through 6C are cross-sectional views illustrating a method of manufacturing a semiconductor device (transistor) by using a thin film patterning method, according to an example embodiment. In the example embodiment, a thin film transistor having a bottom gate structure in which a gate electrode G1 is disposed below a channel layer C1, is manufactured.

Referring to FIG. 6A, the gate electrode G1 may be formed on a substrate SUB1. The substrate SUB1 may be a glass substrate but may be one from among various substrates, such as a plastic substrate, a silicon substrate, and the like, which are used in a general semiconductor device process. The gate electrode G1 may be formed of a general electrode material, for example, a metal or conductive oxide. A gate insulating layer GI1 may be formed on the substrate SUB1 to cover the gate electrode G1. The gate insulating layer GI1 may be formed of silicon oxide, silicon oxynitride, or silicon nitride, or another material, such as a high dielectric material having a higher dielectric constant than that of silicon nitride. The gate insulating layer GI1 may be formed to have a structure in which at least two or more layers from among a silicon oxide layer, a silicon oxynitride layer, a silicon nitride layer, and a high dielectric material are stacked. However, the material and composition of the gate insulating layer GI1 are not limited thereto, and the gate insulating layer GI1 may be modified in various materials and composition.

Referring to FIG. 6B, a channel layer C1 may be formed on the gate insulating layer GI1. The channel layer C1 may be formed by the thin film patterning method described with reference to FIGS. 1, 2A through 2G, and 3. Thus, the channel layer C1 may be a metal oxide thin film. In this case, the metal oxide thin film may have semiconductor characteristics. For example, the channel layer C1 may be a zinc oxide (ZnO) thin film. The channel layer C1 may be a thin film including at least one metal element in addition to ZnO. When a precursor solution used in forming the channel layer C1 includes a precursor of ZnO and a source material of an additional metal element, the channel layer C1 may be formed as a thin film including the additional metal element in addition to ZnO. The additional metal element may be Hf, Y, Ta, Zr, Ti, Cu, Ni, Cr, In, Ga, Al, Sn, Mg, or the like. At least one of the metal elements may be included in the channel layer C1.

Referring to FIG. 6C, a source electrode S1 and a drain electrode D1 that contact first and second regions of the channel layer C1, respectively, may be formed. The source electrode S1 may contact one end of the channel layer C1, and the drain electrode D1 may contact the other end of the channel layer C1. The source electrode S1 and the drain electrode D1 may be formed as a single layer or multi-layer structure. The source electrode S1 and the drain electrode D1 may be formed of the same material as the material for the gate electrode G1 but may be formed of material that is different from the material for the gate electrode G1.

A passivation layer P1 may be formed on the gate insulating layer GI1 to cover the channel layer C1, the source electrode S1, and the drain electrode D1. The passivation layer P1 may be formed as a silicon oxide layer, a silicon oxynitride layer, a silicon nitride layer, or an organic layer, or to have a structure in which at least two layers from among them are stacked. The transistor formed in this way may be annealed at a given (or alternatively, predetermined) temperature.

The processes illustrated in FIGS. 6A through 6C are just examples and may be variously modified. For example, an etch stop layer (not shown) may be further formed on the channel layer C1. The source electrode S1 may be formed to cover one end of the etch stop layer while contacting one end of the channel layer C1, and the drain electrode D1 may be formed to cover the other end of the etch stop layer while contacting the other end of the channel layer C1. The etch stop layer may prevent or inhibit the channel layer C1 from being damaged by an etching process for forming the source electrode S1 and the drain electrode D1.

The etch stop layer may be formed of silicon oxide, silicon nitride, an organic insulation material, or the like, for example. The use of the etch stop layer may be determined based on the material for the channel layer C1 and the materials for the source electrode S1 and the drain electrode D1.

Figure 7A:
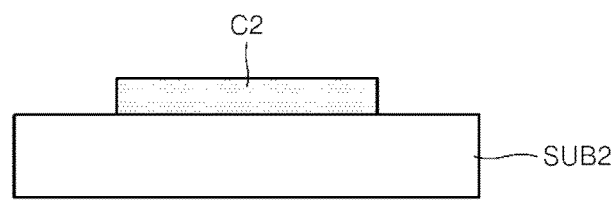
FIGS. 7A through 7C are cross-sectional views illustrating a method of manufacturing a semiconductor device (transistor) by using a thin film patterning method, according to another example embodiment.
Figure 7B:
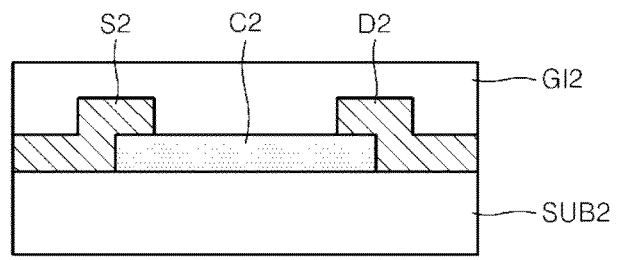
Figure 7C:
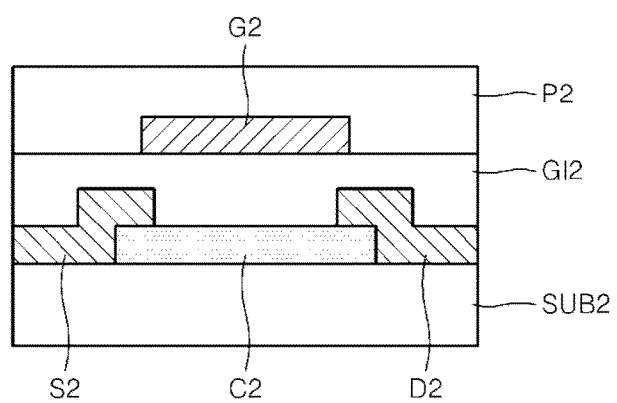

FIGS. 7A through 7C are cross-sectional views illustrating a method of manufacturing a semiconductor device (transistor), according to another example embodiment. In the example embodiment, a thin film transistor having a top gate structure in which a gate electrode G2 is disposed above a channel layer C2, is manufactured.

Referring to FIG. 7A, the channel layer C2 may be formed on a substrate SUB2. A forming method of the channel layer C2 may be the same or similar to the forming method of the channel layer C1 of FIG. 6B. That is, the channel layer C2 may be formed by the thin film patterning method described with reference to FIGS. 1, 2A through 2G, and 3. The material for the channel layer C2 may be the same as or similar to the material for the channel layer C1 of FIG. 6B.

Referring to FIG. 7B, a source electrode S2 and a drain electrode D2 that contact first and second regions, for example, one end and the other end, of the channel layer C2 may be formed on the substrate SUB2. A gate insulating layer GI2 may be formed on the substrate SUB2 to cover the channel layer C2, the source electrode S2, and the drain electrode D2. The gate insulating layer GI2 may be formed of a material which is the same as (or similar to) that of the gate insulating layer GI1 of FIG. 6A, and may have the same stack structure as the gate insulating layer GI1 or an inverse structure thereof.

Referring to FIG. 7C, a gate electrode G2 may be formed on the gate insulating layer GI2. The gate electrode G2 may be disposed above the channel layer C2. A passivation layer P2 may be formed on the gate insulating layer GI2 to cover the gate electrode G2. The passivation layer P2 may be formed of a material which is the same as (or similar to) that of the passivation layer P1 of FIG. 6C, and may have a stack structure which is the same as (or similar to) that of the passivation layer P1 of FIG. 6C. The transistor formed in this way may be annealed at a given (or alternatively, predetermined) temperature.

As described above, a semiconductor device including a thin film, for example, a transistor, may be more easily manufactured using thin film patterning methods according to example embodiments. The thin film patterning methods according to example embodiments may suppress or prevent damage or contamination of the thin film and may be more simply performed than an existing photolithography process. Thus, by using the thin film patterning methods according to example embodiments, characteristics of the semiconductor device may be improved, and manufacturing cost may be reduced.

While the inventive concepts have been particularly shown and described with reference to differing elements thereof, it should be understood that example embodiments should be considered in a descriptive sense only and not for purposes of limitation. For example, it would be appreciated by those of ordinary skill in the art that changes may be made in the processes of the thin film patterning methods illustrated in FIGS. 1 through 3. In addition, it would be appreciated by those of ordinary skill in the art that the idea of the inventive concepts may be applied to other devices than the transistors illustrated in FIGS. 6A through 6C and 7A through 7C without departing from the principles and spirit of the inventive concepts. Therefore, the scope of the inventive concepts is defined not by the detailed description but by the appended claims.

What is claimed is:

1. A method of forming a patterned oxide semiconductor thin film, the method comprising:
    preparing a precursor solution including a precursor of metal oxide, the precursor including metal acetate, the metal acetate including a compound of $O_2CCH_3$;
    forming a thin film by coating the precursor solution onto a substrate;
    soft baking the thin film;
    exposing the thin film to light using a photomask in an ozone atmosphere;
    developing the thin film by removing an unexposed portion of the thin film; and
    hard baking the developed thin film to form the patterned oxide semiconductor thin film.

2. The method of claim 1, wherein the preparing a precursor solution includes preparing a precursor solution including metal acetate hydrate.

3. The method of claim 1, wherein the preparing a precursor solution includes preparing a precursor of zinc oxide, the precursor of zinc oxide including one of zinc acetate and zinc acetate dihydrate.

4. The method of claim 1, wherein the preparing a precursor solution includes dissolving the precursor of metal oxide using 2-methoxyethanol as a solvent.

5. The method of claim 4, wherein the preparing a precursor solution includes adding ethanolamine as an additive.

6. The method of claim 1, wherein the preparing a precursor solution includes adding ethanolamine as an additive.

7. The method of claim 1, wherein the soft baking the thin film includes soft baking the thin film at a temperature of 50° C. to 80° C.

8. The method of claim 1, wherein the soft baking the thin film includes soft baking the thin film for about 30 seconds to about 5 minutes.

9. The method of claim 1, wherein the exposing the thin film includes exposing the thin film using ultraviolet rays (UV).

10. The method of claim 1, wherein the developing the thin film includes developing the thin film using a developing solution including 2-methoxyethanol.

11. The method of claim 1, wherein the developing the thin film comprises:
    immersing the substrate into a developing solution; and
    applying ultrasonic vibration to the thin film immersed in the developing solution.

12. The method of claim 1, wherein the hard baking the developed thin film includes hard baking the developed thin film at a temperature of about 300° C. to about 600° C.

13. A method of forming a patterned oxide semiconductor thin film, the method comprising:
    preparing a precursor solution including a metal acetate-based material as a precursor of metal oxide, the metal acetate-based material including a compound of $O_2CCH_3$;
    forming a thin film by coating the precursor solution onto a substrate;
    soft baking the thin film at a temperature of about 50° C. to about 80° C.;
    exposing the thin film to ultraviolet rays (UV) through a photomask in an ozone atmosphere;
    developing the thin film by removing an unexposed portion of the thin film using a developing solution including 2-methoxyethanol; and
    hard baking the developed thin film to form the patterned oxide semiconductor thin film.

14. A method of manufacturing a transistor, comprising:
    forming a channel layer;
    forming a source and a drain connected to first and second regions of the channel layer, respectively; and
    forming a gate corresponding to the channel layer,
    wherein the forming a channel layer comprises forming a patterned oxide semiconductor thin film using the method of claim 1.

15. The method of claim 14, wherein the forming a channel layer includes forming a zinc oxide (ZnO) thin film.

16. The method of claim 15, wherein the forming a channel layer includes forming a zinc oxide (ZnO) thin film including at least one additional metal element.

17. The method of claim 14, wherein the forming a gate includes forming the gate below the channel layer.

18. The method of claim 14, wherein the forming a gate includes forming the gate above the channel layer.

* * * * *